United States Patent
Xu et al.

(10) Patent No.: US 11,569,270 B2
(45) Date of Patent: Jan. 31, 2023

(54) DRIVE BACKBOARD, MANUFACTURING METHOD THEREOF, DISPLAY PANEL AND DISPLAY DEVICE

(71) Applicant: BOE TECHNOLOGY GROUP CO., LTD., Beijing (CN)

(72) Inventors: Sheng Xu, Beijing (CN); Huili Wu, Beijing (CN); Lizhen Zhang, Beijing (CN); Wei He, Beijing (CN); Xuefei Zhao, Beijing (CN); Shipei Li, Beijing (CN); Fang He, Beijing (CN); Dongsheng Yin, Beijing (CN); Renquan Gu, Beijing (CN); Wusheng Li, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 63 days.

(21) Appl. No.: 16/824,062

(22) Filed: Mar. 19, 2020

(65) Prior Publication Data
US 2021/0159363 A1 May 27, 2021

(30) Foreign Application Priority Data
Nov. 21, 2019 (CN) .......................... 201911148438.3

(51) Int. Cl.
*H01L 25/075* (2006.01)
*H01L 33/62* (2010.01)
*H01L 27/12* (2006.01)

(52) U.S. Cl.
CPC ........ *H01L 27/124* (2013.01); *H01L 25/0753* (2013.01); *H01L 33/62* (2013.01); *H01L 2933/0066* (2013.01)

(58) Field of Classification Search
CPC . H01L 25/0753; H01L 33/62; H01L 33/0095; H01L 2933/0066; H01L 27/124–1244; H01L 27/15–156; H01L 22/22; G09G 3/32; G09G 2300/0413; G09G 2330/08; G09G 2300/06; G02F 1/134345; G02F 2201/506
See application file for complete search history.

(56) References Cited

U.S. PATENT DOCUMENTS

| | | | | |
|---|---|---|---|---|
| 2019/0157340 A1* | 5/2019 | Liao | .................... | H01L 25/0753 |
| 2021/0110748 A1* | 4/2021 | Kim | .................... | H01L 33/0095 |
| 2021/0135047 A1* | 5/2021 | Takeya | .................... | H01L 33/62 |
| 2021/0265524 A1* | 8/2021 | Lai | ...................... | H01L 33/0095 |
| 2021/0280741 A1* | 9/2021 | Lo | ..................... | H01L 27/14692 |

* cited by examiner

*Primary Examiner* — Yu Chen
(74) *Attorney, Agent, or Firm* — Collard & Roe, P.C.

(57) ABSTRACT

A drive backboard, a manufacturing method thereof, a display panel and a display device are provided. The drive backboard includes a plurality of pixel units and a plurality of spare electrode groups. Each pixel unit includes m subpixel units, and m is a positive integer greater than or equal to 2. Each spare electrode group includes two first spare electrodes and one second spare electrode; two adjacent $i^{th}$ subpixel units respectively use one first spare electrode in each spare electrode group and share one second spare electrode in each spare electrode group, where i is a positive integer from 1 to m.

14 Claims, 4 Drawing Sheets

11,569,270 B2

DRIVE BACKBOARD, MANUFACTURING METHOD THEREOF, DISPLAY PANEL AND DISPLAY DEVICE

CROSS-REFERENCE TO RELATED APPLICATION

This application claims priority to Chinese Patent Application No. 201911148438.3 filed on Nov. 21, 2019 at CNIPA, titled "Drive Backboard, Manufacturing Method thereof, Display Panel and Display Device", the disclosure of which is hereby incorporated by reference in its entirety.

TECHNICAL FIELD

The embodiments of the present application relate to a drive backboard, a manufacturing method thereof, a display panel and a display device.

BACKGROUND

Mini light emitting diode (Mini LED) and micro light emitting diode (Micro LED) technology, as a new generation of display technology, is obtained by minimizing the structure of light-emitting diodes (LEDs). This technology inherits the characteristics of LEDs and has the advantages of low power consumption, high brightness, ultra high resolution and color saturation, fast response speed, ultra power saving, long service life and high efficiency.

SUMMARY

Embodiments of the present disclosure provides a a drive backboard, a manufacturing method thereof, a display panel and a display device.

At least one embodiment of the present disclosure provides a drive backboard, comprising: a plurality of pixel units and a plurality of spare electrode groups, wherein each pixel unit includes m subpixel units, and m is a positive integer greater than or equal to 2; each spare electrode group includes two first spare electrodes and one second spare electrode; and two adjacent $i^{th}$ subpixel units respectively use one first spare electrode in each spare electrode group and share one second spare electrode in the each spare electrode group, where i is a positive integer from 1 to m.

For example, each first spare electrode is an anode and each second spare electrode is a cathode.

For example, the drive backboard further comprises: a plurality of anode leads, a plurality of cathode leads and a plurality of main electrode groups, each main electrode group including one first electrode and one second electrode; each subpixel unit uses one of the plurality of main electrode groups; the first electrode and the one first spare electrode used by each subpixel unit are respectively electrically connected with a same anode lead; and the second electrode and the one second spare electrode used by each subpixel unit are respectively electrically connected with a same cathode lead.

For example, each subpixel unit includes a light-emitting element; two ends of the light-emitting element are respectively connected with the first electrode and the second electrode; or when a dead subpixel in the first electrode and the second electrode presents, two ends of the light-emitting element are respectively connected with the first spare electrode and the second spare electrode.

For example, the light-emitting element is a mini light-emitting diode (Mini LED) chip or a micro light-emitting diode (Micro LED) chip.

For example, the m subpixel units of each pixel unit are arranged in a same column; two adjacent subpixel units in adjacent columns share one second spare electrode; three spare electrodes in the spare electrode group are arranged transversely; and the second spare electrode is disposed between the two first spare electrodes.

For example, the m subpixel units of each pixel unit are arranged in a same row; two adjacent subpixel units in adjacent rows share one second spare electrode; three spare electrodes in the spare electrode group are longitudinally arranged; and the second spare electrode is disposed between the two first spare electrodes.

For example, m is 3 or 4.

At least one embodiment of the present disclosure also provides a drive backboard, comprising: a plurality of pixel units, each pixel unit including m subpixel units, and m is a positive integer greater than or equal to 2; a plurality of spare electrode groups, each spare electrode group including two first spare electrodes and one second spare electrode; two adjacent $i^{th}$ subpixel units respectively use one first spare electrode in each spare electrode group and share one second spare electrode in each spare electrode group, and i is a positive integer from 1 to m; a plurality of anode leads; a plurality of cathode leads; and a plurality of main electrode groups, each main electrode group including one first electrode and one second electrode, and each suppixel unit uses one main electrode group. The first electrode and the first spare electrode used by each subpixel unit are respectively electrically connected with a same anode lead; the second electrode and the second spare electrode used by each subpixel unit are respectively electrically connected with a same cathode lead. Each subpixel unit includes a light-emitting element; two ends of the light-emitting element are respectively connected with the first electrode and the second electrode; or when a dead subpixel in the first electrode and the second electrode presents, two ends of the light-emitting element are respectively connected with the first spare electrode and the second spare electrode.

For example, the m subpixel units of each pixel unit are arranged a the same column; two adjacent subpixel units in adjacent columns share one second spare electrode; three spare electrodes in the spare electrode group are transversely arranged; and the second spare electrode is disposed between the two first spare electrodes.

For example, the m subpixel units of each pixel unit are arranged in a same row; two adjacent subpixel units in adjacent rows share one second spare electrode; three spare electrodes in the spare electrode group are longitudinally arranged; and the second spare electrode is disposed between the two first spare electrodes.

For example, m is 3 or 4.

At least one embodiment of the present disclosure provides a display panel, comprising the drive backboard.

At least one embodiment of the present disclosure also provides a display device, comprising the display panel according to claim 13.

At least one embodiment of the present disclosure also provides a method of manufacturing a drive backboard, comprising, forming first leads on a base substrate; depositing an insulating layer on the first leads and forming a plurality of through holes on the insulating layer, the through holes exposing the first leads; forming second leads and corresponding electrode on the insulating layer, the electrode including a plurality of main electrode groups and a plurality of spare electrode groups, each main electrode group including one first electrode and one second electrode, each spare electrode group including two first spare electrodes and one second spare electrode, each main electrode group and each first spare electrode in each spare electrode group being respectively used by one subpixel unit, one second spare electrode in each spare electrode group being shared by two adjacent $i^{th}$ subpixel units, where i is a positive integer from 1 to m, and m indicates the count of subpixel units in each pixel unit; and mounting a light-emitting element of each subpixel unit on the main electrode group.

For example, the forming the first leads on the base substrate includes: forming the first leads by performing coating and etching on the base substrate; and the forming the second leads and corresponding electrode on the insulating layer includes: forming the second leads and corresponding electrode by performing coating and etching on the insulating layer.

For example, detecting whether each subpixel unit is a dead subpixel; and transferring the light-emitting element on the dead subpixel to the first spare electrode and the second spare electrode used by the subpixel unit, the first electrode and the first spare electrode used by each subpixel unit being respectively electrically connected with a same anode lead, and the second electrode and the second spare electrode used by each subpixel unit are respectively electrically connected with a same cathode lead.

For example, m is 3 or 4.

BRIEF DESCRIPTION OF THE DRAWINGS

Embodiments of the present disclosure will be described in more detail below with reference to drawings to enable one of ordinary skill in the art understand embodiments of the present disclosure more clearly, in which.

DETAILED DESCRIPTION

Technical solutions of the embodiments will be described in a clearly and fully understandable way in connection with the drawings related to the embodiments of the disclosure. It is apparent that the described embodiments are a part but not all of the embodiments of the disclosure. Based on the described embodiments herein, one of ordinary skill in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as 'first,' 'second,' or the like, which are used in the description and the claims of the present disclosure, are not intended to indicate any sequence, amount or importance, but for distinguishing various components. The terms, such as 'comprise/comprising,' 'include/including,' or the like are intended to specify that the elements or the objects stated before these terms encompass the elements or the objects and equivalents thereof listed after these terms, but not preclude other elements or objects. The terms, 'on,' 'under,' or the like are only used to indicate relative position relationship, and when the absolute position of the object which is described is changed, the relative position relationship may be changed accordingly.

The inventors have noted that in the process of manufacturing Mini LED and Micro LED display panels, pixel array processing can be achieved by massively transferring and binding LED chip arrays on a drive backboard. As dead pixels are inevitable in the massively transferring and binding process, in the manufacturing process of the drive backboard, one pair of spare electrodes are usually reserved for each pair of subpixel electrodes, so the total count of electrodes of the entire backboard is doubled. Thus, not only the production cost is increased but also the pixel density (PPI) cannot be further improved.

Figure 1:
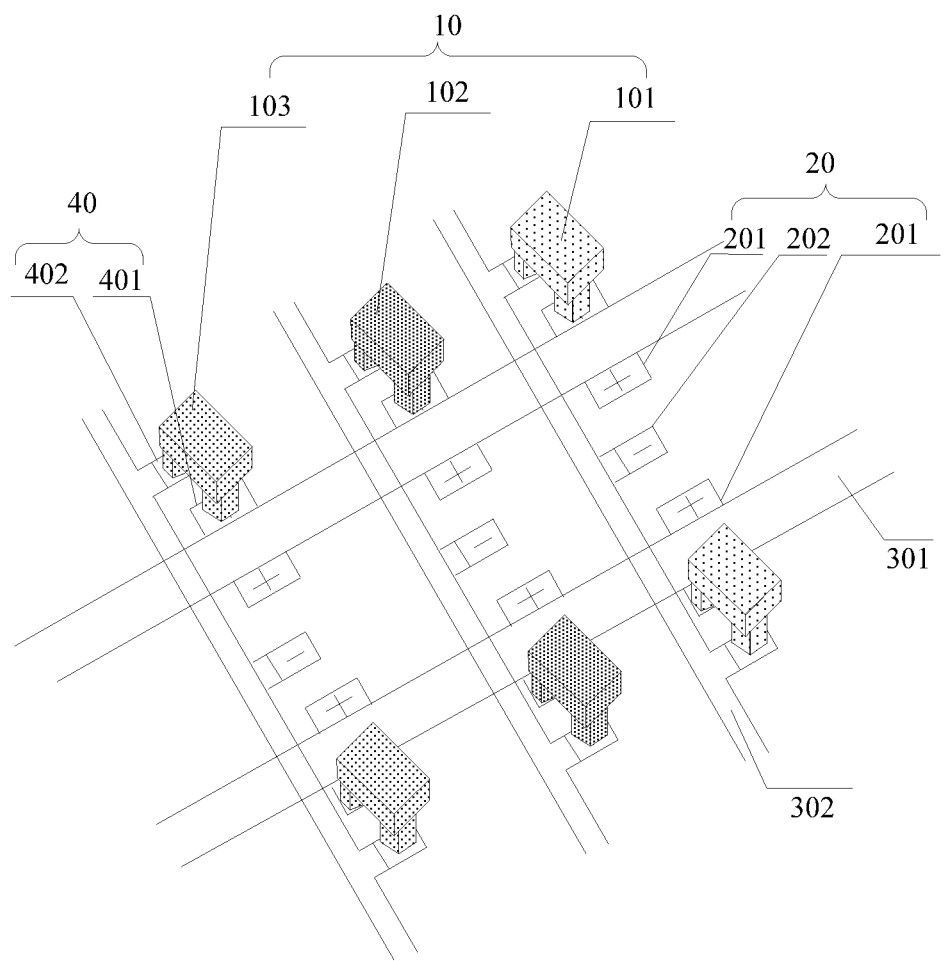
FIG. 1 is a schematically structural view of an exemplary drive backboard provided by an embodiment of the present application.

An embodiment of the present application provides a drive backboard. FIG. 1 is a schematically structural view of the drive backboard provided by the embodiment of the present application. As shown in FIG. 1, the drive backboard provided by the embodiment of the present application includes: a plurality of pixel units 10 and a plurality of spare electrode groups 20, in which each pixel unit 10 includes m subpixel units, where m is a positive integer greater than or equal to 2 (exemplarily, m in FIG. 1 is 3, namely each pixel unit 10 includes three subpixel units: a first subpixel unit 101, a second subpixel unit 102, and a third subpixel unit 103).

Each spare electrode group 20 includes two first spare electrodes 201 and one second spare electrode 202.

Two adjacent $i^{th}$ subpixel units respectively use one first spare electrode 201 in each spare electrode group 20 and share one second spare electrode 202 in each spare electrode group 20, where i is a positive integer from 1 to m.

As two adjacent $i^{th}$ subpixel units share one second spare electrode, in the drive backboard provided by the embodiment of the present application, the count of the second spare electrodes is effectively decreased, the production cost is reduced, and the PPI is increased.

In some exemplary embodiments of the present application, the first spare electrode 201 is an anode and the second spare electrode 202 is a cathode.

In some exemplary embodiments of the present application, the drive backboard further comprises a plurality of anode leads 301, a plurality of cathode leads 302 and a plurality of main electrode groups 40. Each main electrode group 40 includes one first electrode 401 and one second electrode 402. Each subpixel unit 101,102,103 respectively uses one main electrode group 40.

The first electrode 401 and the first spare electrode 201 used by each subpixel unit 101,102,103 are respectively electrically connected with a same anode lead 301, and the second electrode 402 and the second spare electrode 202 used by each subpixel unit 101,102,103 are respectively electrically connected with a same cathode lead 302.

In some exemplary embodiments of the present application, each subpixel unit 10 includes a light-emitting element; two ends of the light-emitting element are respectively connected with the first electrode 401 and the second electrode 402; or when a dead subpixel presents in the first electrode 401 and the second electrode 402, two ends of the light-emitting element are respectively connected with the first spare electrode 201 and the second spare electrode 202.

In some exemplary embodiments of the present application, the light-emitting element may be a Mini LED chip or a Micro LED chip.

In some exemplary embodiments of the present application, the m subpixel units of each pixel unit 10 are longitudinally arranged a a same column; two adjacent subpixel units in adjacent columns share one second spare electrode 202; three spare electrodes in the spare electrode group 20 are transversely arranged; and the second spare electrode 202 is disposed between the two first spare electrodes 201.

Or, the m subpixel units of each pixel unit 10 are transversely arranged in a same row; two adjacent subpixel units in adjacent rows share one second spare electrode 202; the three spare electrodes in the spare electrode group 20 are longitudinally arranged; and the second spare electrode 202 is disposed between the two first spare electrodes 201.

In some exemplary embodiments of the present application, m is 3, and the three subpixel units are respectively a red subpixel unit, a blue subpixel unit, and a green subpixel unit; or m is 4, and the four subpixel units are respectively a red subpixel unit, a blue subpixel unit, a green subpixel unit, and a white subpixel unit.

The embodiments of the present application also provide a display panel, which comprises any foregoing drive backboard. The drive backboard may be disposed on an array substrate.

The embodiments of the present application also provides a display device, which comprises any one of the display panels.

The display device provided by the embodiment of the present application may be any product or component with display function, such as a mobile phone, a tablet, a TV, a display, a notebook computer, a digital album, or a navigator.

The embodiments of the present application also provide a method of manufacturing a drive backboard. The method can reduce the production cost, increase PPI, or the like, of the drive backboard.

Figure 2:
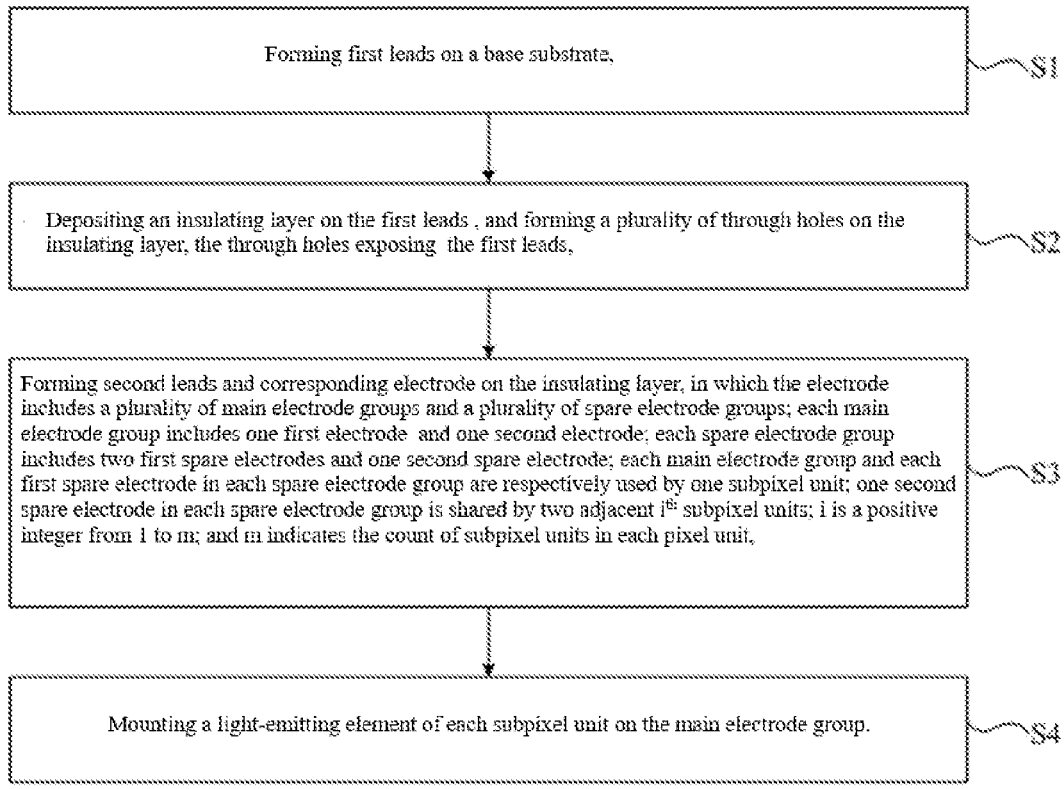
FIG. 2 is a flowchart of an exemplary method of manufacturing a drive backboard provided by an embodiment of the present application.

FIG. 2 is a flowchart of the method of manufacturing a drive backboard provided by an embodiment of the present application. As shown in FIG. 2, the manufacturing method may comprise:

S1: forming first leads 60 on a base substrate 50. The formed structure is as shown in FIG. 3A.

For instance, the base substrate is a flexible base substrate. The flexible base substrate may be made from, but not limited to, one or more of polyethylene terephthalate (PET), ethylene terephthalate, polyether-ether-ketone (PEEK), polystyrene, polycarbonate, polyarylate, polyarylester, polyimide (PI), polyvinyl chloride, polyethylene, or textile fibers. For instance, the base substrate is made from transparent PI.

For instance, the step of forming the first leads 60 on the base substrate 50 includes: forming the first leads 60 by performing coating and etching processes on the base substrate 50.

Figure 3A:
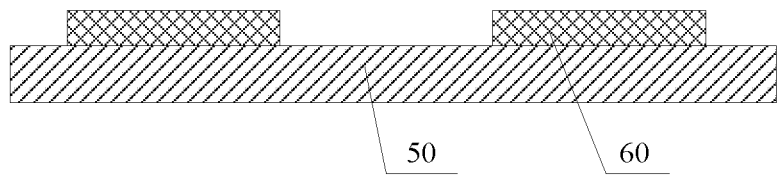
FIG. 3A is a schematic diagram obtained after a first lead pattern is formed in an embodiment of the present application.

For instance, the step of forming the first leads 60 includes: depositing a conductive film on a base; coating a layer of photoresist on the conductive film; performing exposure and development processes on the photoresist via a mask; forming unexposed regions at positions of a first lead pattern, and retaining the photoresist; forming completely-exposed regions at other positions, and removing the photoresist; etching the conductive film at the completely-exposed areas; stripping off the remaining photoresist; and forming the pattern of the first leads 60 on the base substrate 50, as shown in FIG. 3A. The conductive film may be made from metallic materials and may also be made from transparent conductive materials, such as indium tin oxide (ITO), indium zinc oxide (IZO), carbon nanotube, graphite, etc. For instance, when the conductive film is made from ITO, the transmittance of a touch module can be improved. Due to the reflectivity of ITO on light being lower compared with metal, the visual impact of the reflected light on users can be reduced.

For instance, the first lead 60 may be an anode lead 301.

Figure 3B:
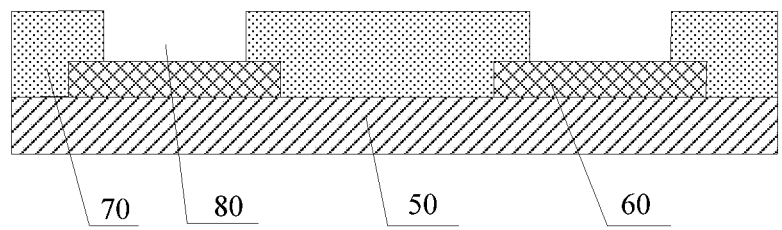
FIG. 3B is a schematic diagram obtained after an insulating layer pattern is formed in an embodiment of the present application.

S2: depositing an insulating layer 70 on the first leads 60, and forming a plurality of through holes 80 on the insulating layer 70. The through holes 80 expose the first leads 60, as shown in FIG. 3B.

For instance, the insulating layer may be made from silicon nitride (SiNx) or silicon dioxide (SiO2).

Figure 3C:
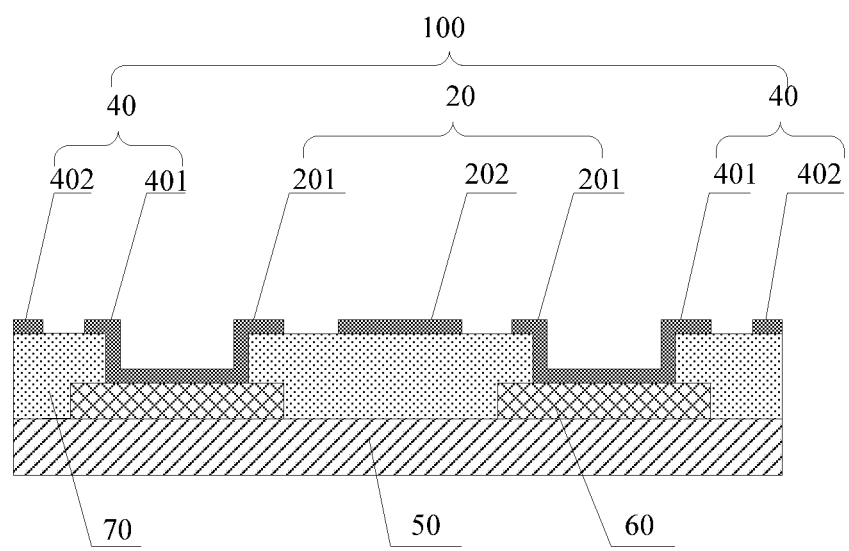
FIG. 3C is a schematic diagram obtained after second leads and corresponding electrode pattern are formed in an embodiment of the present application.

S3: forming second leads (not shown in FIG. 3C) and corresponding electrode 100 on the insulating layer 70. The electrode 100 includes a plurality of main electrode groups 40 and a plurality of spare electrode groups 20. Each main electrode group 40 includes one first electrode 401 and one second electrode 402. Each spare electrode group 20 includes two first spare electrodes 201 and one second spare electrode 202. Each main electrode group 40 and each first spare electrode 201 of each spare electrode group 20 are respectively used by one subpixel unit. The one second spare electrode 202 in each spare electrode group 20 is shared by two adjacent $i^{th}$ subpixel units, where i is a positive integer from 1 to m, and m indicates the number of subpixel units in each pixel unit, as shown in FIG. 3C.

For instance, the second lead may be the foregoing cathode lead 302, referring to FIG. 1.

For instance, the step of forming the second leads and corresponding electrode 100 on the insulating layer 70 includes forming the second leads and corresponding electrode 100 by performing coating and etching processes on the insulating layer 70.

Figure 3D:
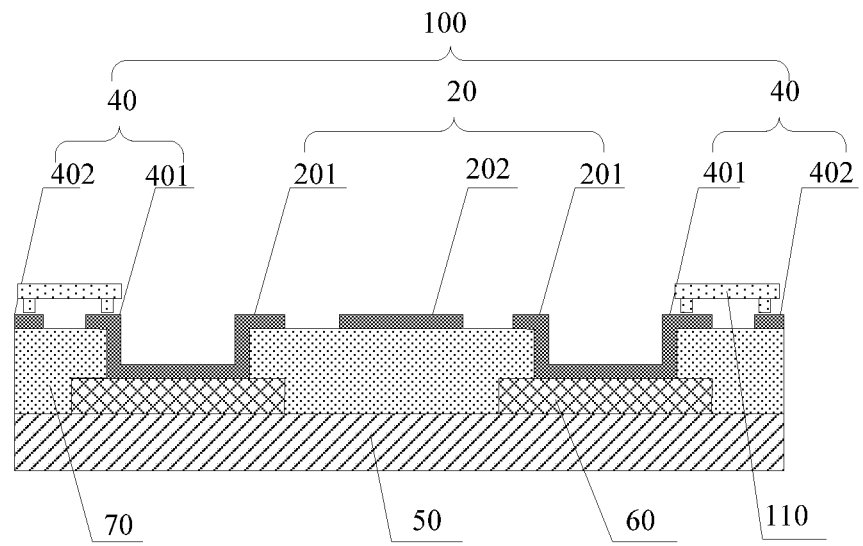
FIG. 3D is a schematic diagram obtained after mounting light-emitting elements of subpixels on main electrode groups in an embodiment of the present application.

S4: mounting a light-emitting element 110 of each subpixel unit on the main electrode group 40, as shown in FIG. 3D.

For instance, the light-emitting element 110 may be a Mini LED chip or a Micro LED chip.

Figure 3E:
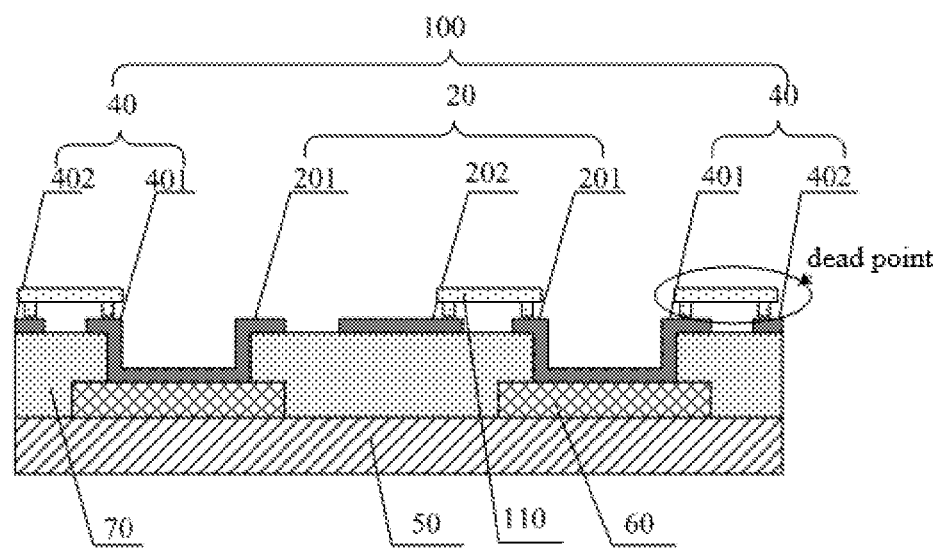
FIG. 3E is a schematic diagram obtained after light-emitting elements of dead subpixels in FIG. 3D are transferred to spare electrode groups.

In some exemplary embodiments of the present application, the manufacturing method may further comprise detecting whether the subpixel unit is a dead subpixel; and transferring the light-emitting element 110 on the dead subpixel to the first spare electrode 201 and the second spare electrode 202 used by the subpixel unit. The first electrode 401 and the first spare electrode 201 used by each subpixel unit are respectively electrically connected with a same anode lead 301, and the second electrode 202 and the second spare electrode 402 used by each subpixel unit are respectively electrically connected with a same cathode lead 302, as shown in FIG. 3E.

The method of manufacturing the drive backboard provided by the embodiments of the present application can reduce production cost and increase PPI of the drive backboard.

The following statements should be noted:

(1) The accompanying drawings involve only the structure(s) in connection with the embodiment(s) of the present disclosure, and other structure(s) can be referred to common design(s).

(2) For the purpose of clarity only, in the accompanying drawings for illustrating the embodiment(s) of the present disclosure, the thickness of a layer or a region may be enlarged or reduced, that is to say, the figures are not drawn according to the actual scale.

(3) Without conflicting with each other, the embodiments of the present disclosure and elements in the embodiments can be combined to obtain new embodiments, and these new embodiments shall fall within the scope of the present disclosure.

The description above is only exemplary embodiments of the present disclosure, and the scope of the present disclosure is not limited thereto. Any changes or substitutions readily conceived by one of ordinary skill in the art without departing the technical scope of the present embodiments, shall fall within the scope of the present disclosure.

What is claimed is:

1. A drive backboard, comprising:
   a plurality of pixel units, wherein each pixel unit includes m subpixel units, m is a positive integer greater than or equal to 2, and each subpixel unit includes a light-emitting element;
   a plurality of anode leads;
   a plurality of cathode leads;
   a plurality of spare pad groups provided in a region between two adjacent anode leads of the plurality of anode leads and two adjacent cathode leads of the plurality of cathode leads;
   wherein each one of the plurality of spare pad groups includes two first spare pads and one second spare pad, and only one second spare pad is present between the two first spare pads;
   each one of the plurality of spare pad groups is provided between a first main pad group and a second main pad group;
   each of the first main pad group and the second main pad group includes a first pad and a second pad;
   wherein the first pad of the first main pad group and one of the two first spare pads are each protruded from one of the two adjacent anode leads, the first pad of the second main pad group and the other of the two first spare pads are each protruded from the other one of the two adjacent anode leads, the second pads of the first and second main pad groups and the one second spare pad are each protruded from one of the two adjacent cathode leads;
   wherein the one second spare pad protruded from the one of the two adjacent cathode leads is disposed directly between the two first spare pads protruded from the two adjacent anode leads along a direction parallel to the two adjacent cathode leads; and
   wherein for each one of the plurality of spare pad groups, one of the following conditions is satisfied based upon detection of a dead subpixel unit:
   a) subpixel units of two adjacent pixel units correspond to the first main pad group and the second main pad group, and no light-emitting element is provided corresponding to the spare pad group,
   b) subpixel units of two adjacent pixel units correspond to the second main pad group and the spare pad group, and no light-emitting element is provided corresponding to the first main pad group, wherein the light-emitting element of the spare pad group is connected with the one second spare pad and the one of the two first spare pads, and
   c) subpixel units of two adjacent pixel units correspond to the first main pad group and the spare pad group, and no light-emitting element is provided corresponding to the second main pad group, wherein the light-emitting element of the spare pad group is connected with the one second spare pad and the other of the two first spare pads.

2. The drive backboard according to claim 1, wherein each of the two first spare pads is an anode and the one second spare pad is a cathode.

3. The drive backboard according to claim 1, wherein the light-emitting element is a mini light-emitting diode (Mini LED) chip or a micro light-emitting diode (Micro LED) chip.

4. The drive backboard according to claim 3, wherein the LEDs of a same color are provided corresponding to the subpixel units of the two adjacent pixel units.

5. The drive backboard according to claim 1, wherein the m subpixel units of each pixel unit are arranged in a same column.

6. The drive backboard according to claim 1, wherein the m subpixel units of each pixel unit are arranged in a same row.

7. The drive backboard according to claim 1, wherein m is 3 or 4.

8. A display panel, comprising the drive backboard according to claim 1.

9. A display device, comprising the display panel according to claim 8.

10. The drive backboard according to claim 1, wherein, for each of the spare pad groups, a number of the first spare pads is greater than a number of the second spare pads.

11. The drive backboard according to claim 10, wherein, for each of the spare pad groups, the number of the first spare pads is two times of the number of the second spare pads.

12. A method of manufacturing a drive backboard, comprising:
   forming a plurality of pixel units, wherein each pixel unit includes m subpixel units, m is a positive integer greater than or equal to 2, and each subpixel unit includes a light-emitting element;
   forming a plurality of anode leads;
   forming a plurality of cathode leads;
   forming a plurality of spare pad groups provided in a region between two adjacent anode leads of the plurality of anode leads and two adjacent cathode leads of the plurality of cathode leads;
   wherein each one of the plurality of spare pad groups includes two first spare pads and one second spare pad, and only one second spare pad is present between the two first spare pads;
   each one of the plurality of spare pad groups is provided between a first main pad group and a second main pad group;
   each of the first main pad group and the second main pad group includes a first pad and a second pad;
   wherein the first pad of the first main pad group and one of the two first spare pads are each protruded from one of the two adjacent anode leads, the first pad of the second main pad group and the other of the two first spare pads are each protruded from the other one of the two adjacent anode leads, the second pads of the first and second main pad groups and the one second spare pad are each protruded from one of the two adjacent cathode leads;

wherein the one second spare pad protruded from the one of the two adjacent cathode leads is disposed directly between the two first spare pads protruded from the two adjacent anode leads along a direction parallel to the two adjacent cathode leads; and wherein for each one of the plurality of spare pad groups, one of the following conditions is satisfied based upon detection of a dead subpixel unit:

a) subpixel units of two adjacent pixel units correspond to the first main pad group and the second main pad group, and no light-emitting element is provided corresponding to the spare pad group, b) subpixel units of two adjacent pixel units correspond to the second main pad group and the spare pad group, and no light-emitting element is provided corresponding to the first main pad group, wherein the light-emitting element of the spare pad group is connected with the one second spare pad and the one of the two first spare pads, and c) subpixel units of two adjacent pixel units correspond to the first main pad group and the spare pad group, and no light-emitting element is provided corresponding to the second main pad group, wherein the light-emitting element of the spare pad group is connected with the one second spare pad and the other of the two first spare pads.

13. The manufacturing method according to claim 12, further comprising:

forming a base substrate;

forming the plurality of anode leads, the first spare pads, and the first pads by performing coating and etching on the base substrate;

forming an insulating layer on the plurality of anode leads; and forming the plurality of cathode leads, the second spare pads, and the second pads by performing coating and etching on the insulating layer.

14. The manufacturing method according to claim 12, wherein m is 3 or 4.

* * * * *